(12) United States Patent
Gallagher et al.

(10) Patent No.: US 9,052,617 B2
(45) Date of Patent: Jun. 9, 2015

(54) EXTREME ULTRAVIOLET (EUV) MULTILAYER DEFECT COMPENSATION AND EUV MASKS

(71) Applicant: International Business Machines Corporation, Armonk, NY (US)

(72) Inventors: Emily E. Gallagher, Burlington, VT (US); Gregory R. McIntyre, Clifton Park, NY (US); Alfred Wagner, Brewster, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/293,422

(22) Filed: Jun. 2, 2014

(65) Prior Publication Data

US 2014/0272687 A1    Sep. 18, 2014

Related U.S. Application Data

(63) Continuation of application No. 13/564,221, filed on Aug. 1, 2012, now Pat. No. 8,748,063.

(51) Int. Cl.
| | |
|---|---|
| *G03F 1/22* | (2012.01) |
| *G03F 1/24* | (2012.01) |
| *G03F 1/72* | (2012.01) |
| *G03F 1/74* | (2012.01) |

(52) U.S. Cl.
CPC .. *G03F 1/74* (2013.01); *G03F 1/22* (2013.01); *G03F 1/24* (2013.01); *G03F 1/72* (2013.01)

(58) Field of Classification Search
CPC .............. G03F 1/22; G03F 1/24; G03F 1/72; G03F 1/74
USPC ....................................... 430/5, 30
See application file for complete search history.

(56) References Cited

U.S. PATENT DOCUMENTS

| | | | |
|---|---|---|---|
| 6,897,157 B2 | 5/2005 | Liang et al. | |
| 6,967,168 B2 | 11/2005 | Stearns et al. | |
| 7,171,034 B2 | 1/2007 | Wu et al. | |
| 7,189,655 B2 | 3/2007 | Takaoka | |
| 7,230,695 B2 | 6/2007 | Ikuta et al. | |
| 7,691,541 B2 | 4/2010 | Crocker et al. | |
| 2006/0234135 A1 | 10/2006 | Hau-Riege et al. | |
| 2008/0318138 A1 | 12/2008 | Holfeld | |

OTHER PUBLICATIONS

R. Jonckheere et al., "Evidence of printing blank-related defects on EUV masks, missed by blank inspection," Proc. SPIE, vol. 7985, 2011, 79850W, 10 pages.
A. Barty et al., "A method for repairing amplitude defects in multilayer-coated EUV mask blanks," Lawrence Livermore National Laboratory, UCRL-JRNL-200816, Nov. 6, 2003, also published in Applied Optics, vol. 43, Issue 36, Oct. 20, 2003, 40 pages.
P. B. Mirkarimi et al., "Method for repairing Mo/Si multilayer thin film phase defects in reticles for extreme ultraviolet lithography," J. Appl. Phys. vol. 91, 2002, pp. 81-89.

*Primary Examiner* — Christopher Young
(74) *Attorney, Agent, or Firm* — Michael J. LeStrange; Roberts Mlotkowski Safran & Cole, P.C.

(57) ABSTRACT

Methods and structures for extreme ultraviolet (EUV) lithography are disclosed. A method includes determining a phase error correction for a defect in an EUV mask, determining an amplitude error correction for the EUV mask based on both the defect in the EUV mask and the phase error correction, and modifying the EUV mask with the determined phase error correction and the determined amplitude error correction.

9 Claims, 14 Drawing Sheets

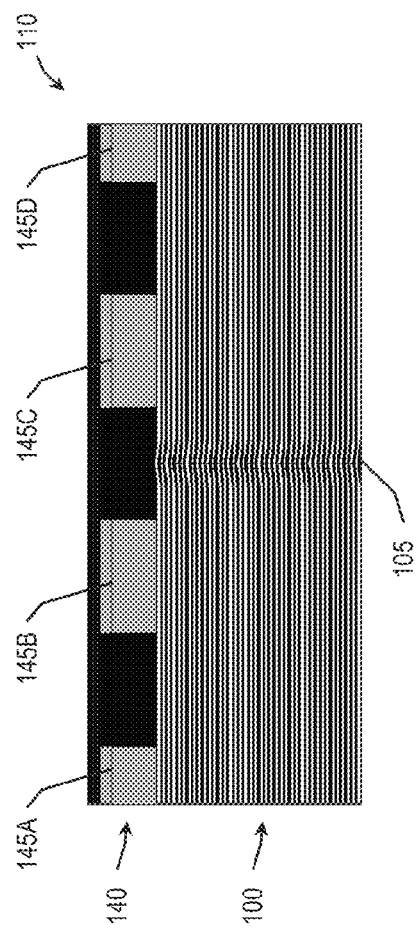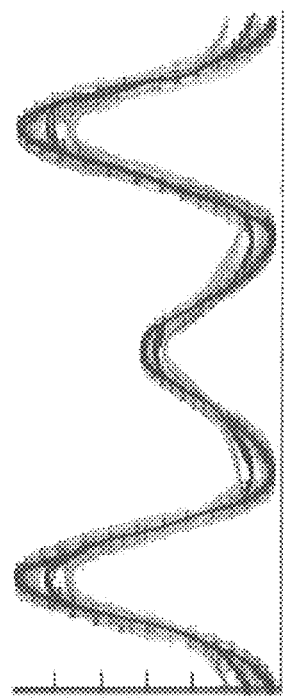

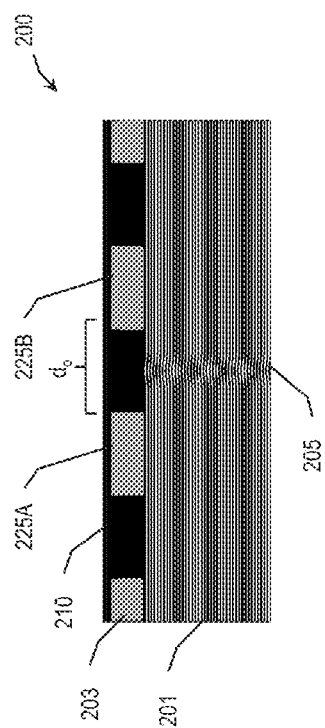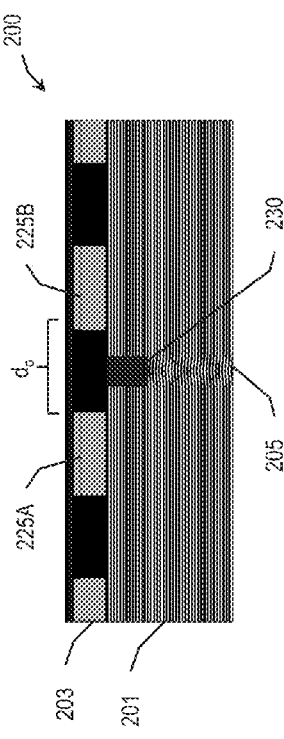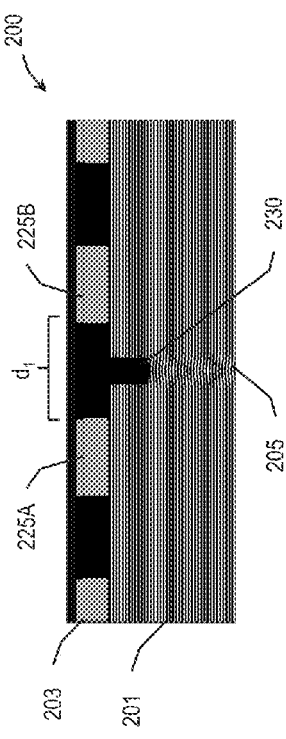

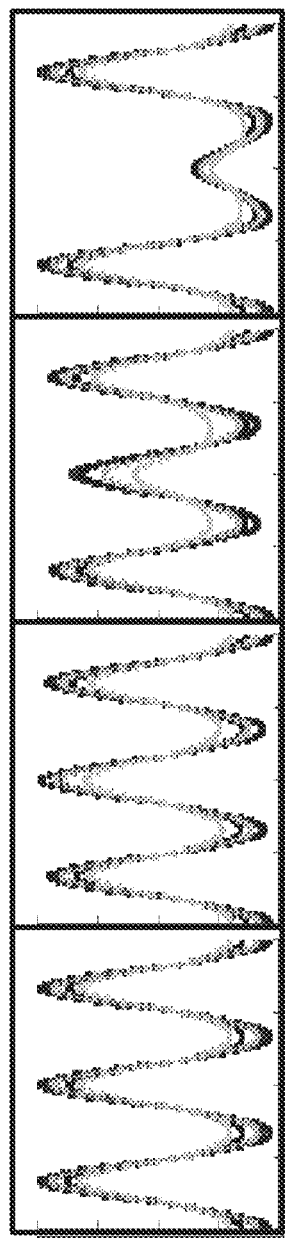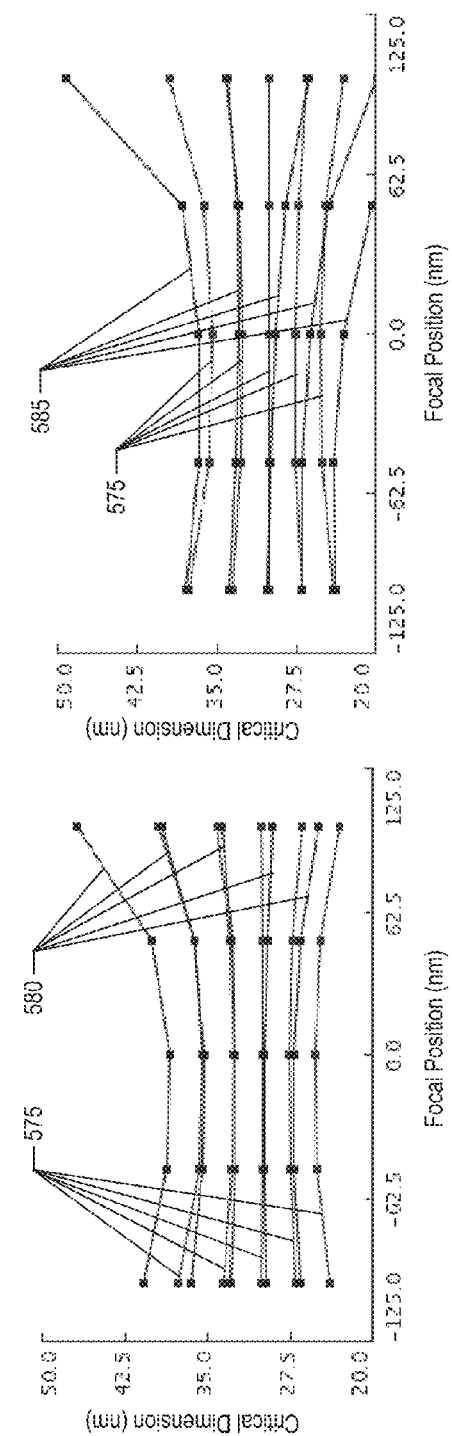

EXTREME ULTRAVIOLET (EUV) MULTILAYER DEFECT COMPENSATION AND EUV MASKS

FIELD OF THE INVENTION

The invention relates to microelectronic device manufacturing and, more specifically, to manufacturing microelectronic devices by extreme ultraviolet (EUV) lithography and EUV masks.

BACKGROUND

In manufacturing microelectronic devices, structures are formed in layers using lithographic processes. In such processes, resist patterns in a mask are projected onto a resist material deposited on, for example, a semiconductor wafer. Extreme ultraviolet ("EUV") lithography uses short wavelength radiation (e.g., about 13.5 nm) to form smaller microelectronic devices than produced by earlier methods. Due to the short wavelength employed in EUV lithography, EUV masks typically comprise a substrate, a reflective multilayer mirror (i.e., a Bragg reflector) disposed on the substrate, and a patterned masking layer disposed on the multilayer mirror. However, defects may arise during the manufacturing of EUV masks that cause errors in the resist patterns.

Defects within or beneath the multilayer mirror of a EUV mask are called multilayer defects. Multilayer defects may be local deformations of the multilayer mirror due to bumps or pits on the substrate surface that result from, for example, particles, scratches, or other localized variations in thickness. Multilayer defects may cause a variation of the phase and/or amplitude of the ultraviolet radiation projected by the multilayer mirror due to interference. These variations, in turn, may cause defects in the resist materials used to pattern semiconductor wafers.

Most, if not all, EUV masks contain some sort of multilayer defect. Because a particular EUV mask is repeatedly used to manufacture numerous devices, any multilayer defect occurring in the EUV mask impacts all the devices subsequently manufactured. As such, error correction can be attempted to minimize the effects of the multilayer defects. Poor error correction methods insufficiently minimize the multilayer defects, which reduces yield and quality of microelectronic devices manufactured using the EUV mask.

Accordingly, there exists a need in the art to overcome the deficiencies and limitations described hereinabove.

SUMMARY

In an aspect of the invention, a method comprises determining a phase error correction for a defect in an EUV mask. The method further comprises determining an amplitude error correction for the EUV mask based on both the defect in the EUV mask and the phase error correction. The method further comprises modifying the EUV mask with the determined phase error correction and the determined amplitude error correction.

In an aspect of the invention, a method comprises obtaining one or more images produced using an EUV mask having a defect. The method further comprises determining an EUV mask model based on the one or more images, the EUV mask model including a representation of the defect. The method further comprises determining a phase error correction corresponding to the representation of the defect in the EUV mask model. The method further comprises modify the EUV mask model to include a representation of the phase error correction. The method further comprises determining an amplitude error correction corresponding to both the representation of the defect and the phase error correction in the EUV mask model. The method further comprises modifying the EUV mask with the determined phase error correction and the determined amplitude error correction.

In another aspect of the invention, an EUV mask comprises a substrate layer, a multilayer mirror layer on a surface of the substrate layer having a defect, and a mask layer on a surface of the multilayer mirror layer having a plurality of light absorbing features. The multilayer mirror layer further comprises a phase error correction corresponding to the defect. A distance between two or more of the plurality of light absorbing features is based on the defect and the phase error correction.

BRIEF DESCRIPTION OF THE SEVERAL VIEWS OF THE DRAWINGS

The present invention is described in the detailed description that follows, in reference to the noted plurality of drawings by way of non-limiting examples of exemplary embodiments of the present invention.

FIG. 1C shows an exemplary EUV mask including a multilayer defect;

FIG. 1D shows an exemplary image projected on a resist pattern of a semiconductor wafer by the EUV mask shown in FIG. 1C;

FIGS. 2A, 2B, and 2C show an exemplary process for performing error correction of a EUV mask, in accordance with aspects of the present invention;

FIG. 5B shows exemplary images projected on a resist pattern of a semiconductor wafer by the EUV masks shown in FIG. 5A;

FIGS. 5C and 5D show Bossung plots for several of the EUV masks shown in FIG. 5A;

DETAILED DESCRIPTION

The invention relates to microelectronic device manufacturing and, more specifically, to manufacturing microelectronic devices by EUV lithography and EUV masks. According to aspects of the present invention, multilayer defect repair is performed in multiple stages. In one stage, phase error caused by a multilayer defect in a multilayer mirror of an EUV mask is corrected by modifying the multilayer mirror of the EUV mask. In another stage, amplitude error caused by both the multilayer defect and the phase error correction is corrected by modifying a pattern of a mask layer of the EUV mask.

In embodiments, a multilayer defect is a bump or a pit defect that is corrected using one stage that etches the multilayer mirror over the bump defect, and another stage that biases the pattern of the mask layer over the bump defect. In other embodiments, the multilayer defect is a pit or a bump defect that is corrected using one stage that deposits a material on the multilayer mirror over the defect and another stage that biases the pattern of the mask layer over the defect. In further embodiments, a bump defect is corrected using one stage that bombards the multilayer mirror with an ion beam over the bump defect and another stage that biases the pattern of the mask layer over the bump defect. In still further embodiments, a pit defect is corrected using one stage that utilizes a ion beam to produce a helium bubble in a substrate or in the multilayer mirror and another stage that biases the pattern of the mask layer over the pit defect.

Figure 1A:
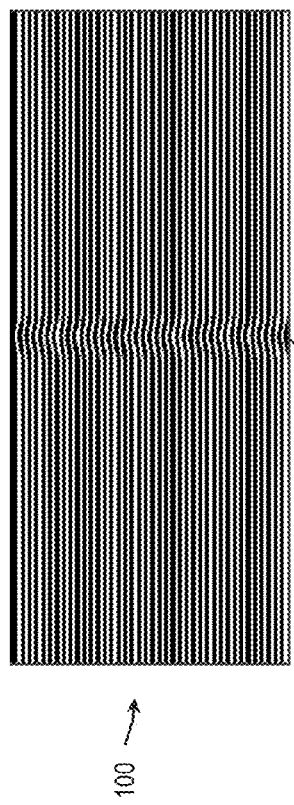
FIG. 1A shows an exemplary multilayer mirror of an EUV mask including a multilayer defect.

FIG. 1A illustrates an exemplary multilayer mirror 100 that includes a bump defect 105. As noted previously, the bump defect 105 may be caused by a surface variation (e.g., a particle) on the substrate (i.e., EUV blank) of the multilayer mirror 100. As depicted in FIG. 1A, the bump defect 105 warps a portion the multilayer mirror 100 over the location of the defect. This warping can affect both the amplitude and phase of the ultraviolet radiation emitted by the multilayer mirror 100 onto a resist pattern.

Figure 1B:
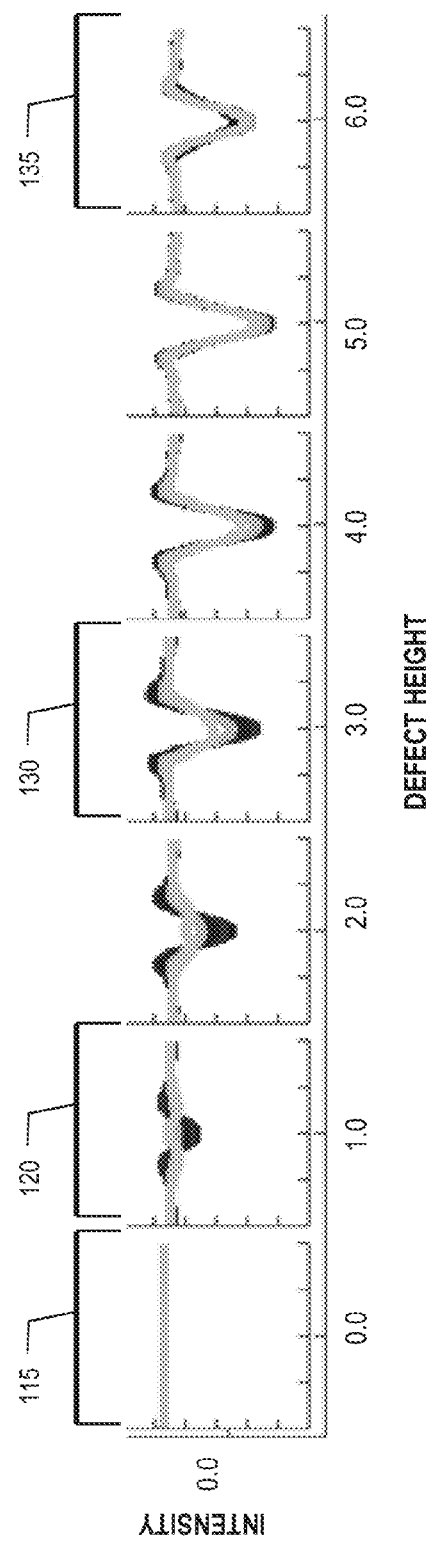
FIG. 1B shows various exemplary images at multiple defocus positions projected in a resist layer on a semiconductor wafer by the EUV mask shown in FIG. 1A.

FIG. 1B shows various exemplary images 115, 120, 130, and 135 at multiple defocus positions projected in a resist layer on a semiconductor wafer by the EUV mask in FIG. 1A having the bump defect 105. More specifically, the horizontal axis of in FIG. 1B corresponds to different potential heights of the bump defect 105 and the vertical axis corresponds to radiation intensity produced over the surface of the resist pattern. More specifically, the radiation intensities depicted in FIG. 1B are distorted in the center of the images corresponding to the bump defect 105, which is centered with respect to the surface of the multilayer mirror 100. A decrease in the magnitude of the average intensity implies an amplitude error of the bump defect 105. This is depicted in FIG. 1B by the arch in the intensity images, which corresponds to the height and location of the bump defect 105. As evident from FIG. 1B, the greater the height of the bump defect 105, the greater the reduction in the intensity. Further, a difference of intensity of the radiation in the images at different focal planes implies a phase error. The phase error is depicted in FIG. 1B by the shift between the dark lines with respect to the lighter lines, which represents the difference in intensity at different focal planes.

As shown in FIG. 1B, a defect height of 0.0 nm (i.e., no defect) results in no phase or amplitude errors in the intensity of image 115. A defect height of 1.0 nm results in a strong phase error but little amplitude error in the intensity of image 120. A defect height of 3.0 results in a strong phase error and a strong amplitude error in the intensity of image 130. A defect height of 6.0 results in little phase error and a very strong amplitude error in intensity of image 135.

FIG. 1C illustrates the multilayer mirror 100, including the bump defect 105, included in an EUV mask 110. The EUV mask 110 further includes a mask pattern 140 formed on the multilayer mirror 100 by features 145A . . . 145D (e.g., absorber material). The presence of the bump defect 105 beneath the features 145B and 145C can result in both phase errors and amplitude errors. For example, FIG. 1D illustrates the intensity of the ultraviolet radiation produced by the mask pattern 140 upon a resist pattern of a wafer (i.e., a device being patterned). As shown, the bump defect 105 causes corresponding defects in the phase and amplitude of the intensity at the wafer plane produced between features 145B and 145C, which will likely cause defects in the critical dimensions of features formed on the wafer.

FIGS. 2A, 2B, and 2C illustrate an error correction process performed on an exemplary EUV mask 200, in accordance with embodiments of the present invention. As depicted in FIG. 2A, the EUV mask 200 includes a multilayer mirror 201 having a mask layer 203 patterned on its upper surface. The mask layer 203 is formed by absorber material, including features 225A and 225B, which are spaced at a distance of $d_o$ (e.g., about 30 nm). In addition, in accordance with the present example, the multilayer mirror 201 has a bump defect 205. Notably, the black area 210 in FIGS. 2A, 2B, and 2C represents open space in the pattern of the mask layer 203, and not structure. Further, it should be noted that the bump defect 205 is illustrated for the sake of example, and the present invention is not limited to correcting bump defects. Different error correction methods in accordance with aspects of the present invention may be used depending on the type and/or magnitude of a defect.

FIG. 2B illustrates one stage of correcting phase error in the EUV mask 200 caused by the bump defect 205 in the multilayer mirror 201 in accordance with aspects of the present invention. According to the present example, the phase error is corrected by forming a trench 230 in a portion of the multilayer mirror 201 above the bump defect 205. The trench may, for example, be formed by etching the surface of the multilayer mirror 201. The trench may also, for example, be formed using an atomic force microscopy (AFM) tip to scrape into the multilayer surface and dig a trench or appropriate dimensions. The etching can be performed using conventional methods, as would be understood by one of ordinary skill in the art. For example, the multilayer mirror 201 can be etched by sputtering the surface of the mirror at a location that is substantially directly over the location of the bump defect 205 with a low energy focused ion beam. In embodiments, the multilayer mirror 201 is etched using an etching gas such as $XeF_2$, which can be introduced into a vacuum system while the multilayer mirror 201 is irradiated with an electron or ion beam, which decomposes the $XeF_2$, to Xe, and F atoms. The F atoms etch the material by forming volatile compounds. The use of other etching gases, such as $MoF_6$ is also contemplated. The formation of the trench 230 over the bump defect 205 corrects the phase error by inducing a phase shift in the radiation emitted from the etched part of an EUV mask. Thus, the trench 230 may be considered a phase error correction in accordance with aspects of the invention. The formation of the trench 230, however, may contribute to amplitude error in the radiation emitted from the etched part of an EUV mask.

FIG. 2C illustrates a stage of correcting the amplitude error in the EUV mask 200 caused by the bump defect 205 in the multilayer mirror 201 and by the phase error correction (i.e., the trench 230) in accordance with aspects of the present invention. According to the present example, the amplitude is corrected by modifying the pattern of the mask layer 203. The pattern of the mask layer 203 can be modified by, for example, biasing the distance $d_0$ (in FIG. 2B) between features 225A and 225B of the pattern above the bump defect 205 to a different distance $d_1$. That is, the distance between features 225A and 225B of the pattern may be increased (e.g., from 30 nm to 35 nm). Biasing the distance between features (e.g., features 225A and 225B) of the mask layer 203 can be accomplished by etching or other material removal processes to remove portions of the absorber material that form the features 225A and 225B. By addressing both the phase error caused by a defect and the amplitude error caused by both the defect and the phase error correction, EUV masks produced in accordance with aspects of the invention result in more accurate EUV masks that produce devices with more precise critical dimensions.

In accordance with aspects of the invention, the corrections to a multilayer mirror (e.g., the width and depth of the trench 230) and a mask layer (e.g., the distance $d_1$ between features 225A and 225B) are determined through modeling and simulation of a particular EUV mask, including the multilayer defect. In embodiments, an actual set of images through focus are produced by the EUV mask 200 is obtained prior to the error correction processing. For example, the actual images through focus produced by the EUV mask 200 having the bump defect 205 as illustrated in FIG. 2A is recorded. Based on the actual images, a simulation model of the EUV mask 200 can be iteratively modified and tested to substantially reproduce the characteristics of the actual images. For example, the simulation model may initially represent the EUV mask 200 depicted in FIG. 2A, but without the bump defect 205. The simulation model can be iteratively modified, e.g., by an engineer and/or an automated tool, by adding one or more representations of multilayer defects (e.g., bump defect and/or pit defects) at different locations and/or different sizes (e.g., height, width, and length) until a simulated images produced by the model substantially reflects the actual images generated by the actual EUV mask 200. The simulation model can then be used to determine phase error and amplitude error corrections (e.g., trench 230 and bias distance $d_1$) that minimize the one or more representations of multilayer defects in the simulation model. For example, a test engineer can use the simulation model to determine the sizes (e.g., height, width, and length) and location of a phase error correction (e.g., trench 230) that minimizes the phase error caused by the multilayer defect 205. Further, the simulation model can be used to determine an amplitude error correction comprising a bias for features of the mask layer 203 (e.g., features 225A and 225B) that minimizes the amplitude error caused by the multilayer defect 205 and the determined phase error correction.

The EUV mask 200 may then be physically modified based on the phase error correction and the amplitude error correction determined using the simulation model. For example, as shown in FIGS. 2B and 2C, the multilayer mirror 201 is etched to create the trench 230 having the determined etch depths and features 225A and 225B of the mask layer 203 are modified according to the determined bias distance $d_1$. Consequently, according to the above-described aspects of the invention, phase errors caused by a defect are corrected. In addition, amplitude errors caused by both the defect and phase error correction are also corrected. By doing so, devices produced using EUV masks corrected in accordance with aspects of the present invention have more accurate critical dimensions, thereby, improving the quality of devices manufactured using the EUV masks.

Figure 3A:
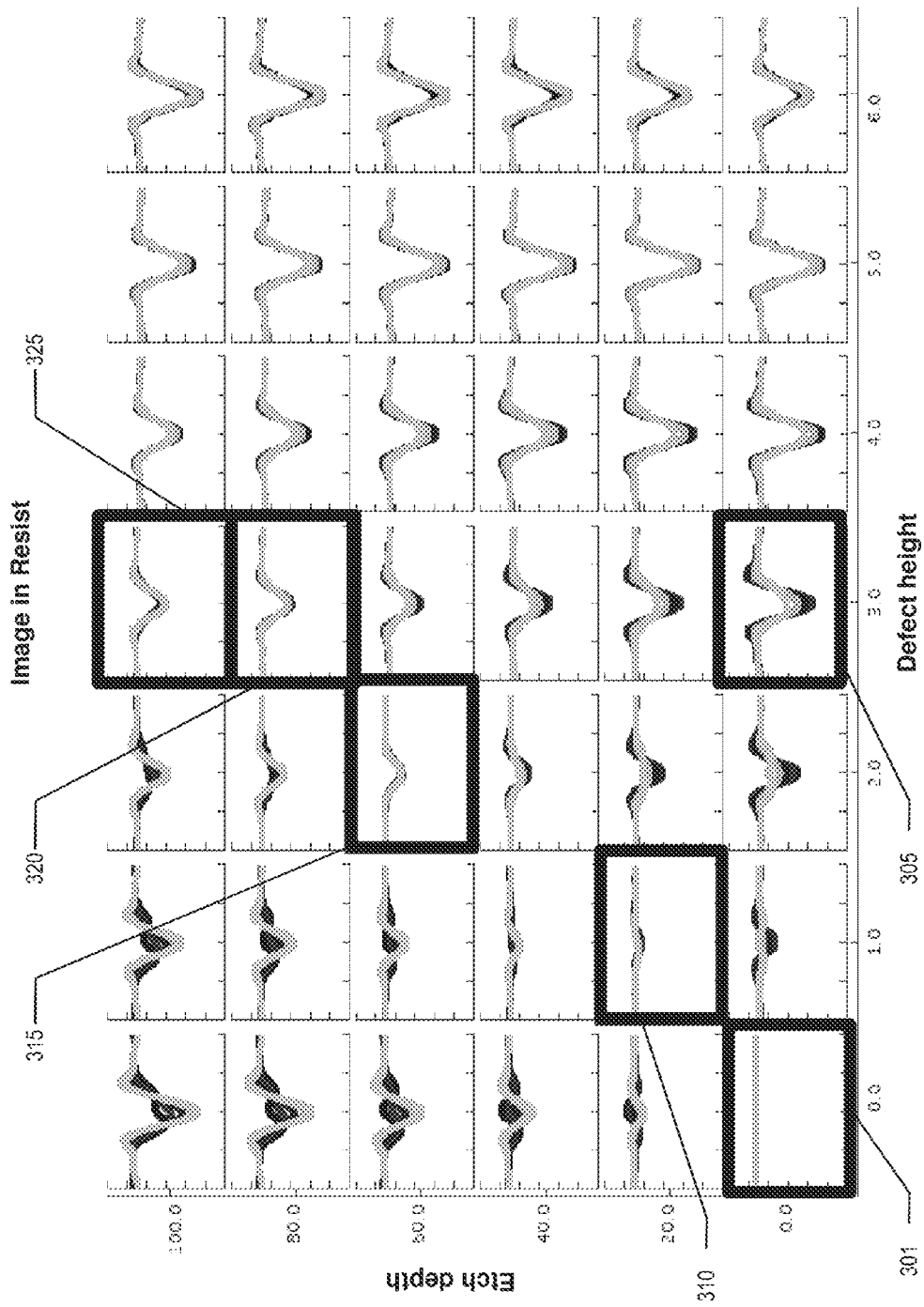
FIG. 3A shows images in resist through focus for various defect height and error correction etch depth values for an exemplary EUV mask.

FIG. 3A shows images in resist through focus for various defect height and error correction (i.e., phase error corrections) etch depth values for an exemplary EUV mask. The images shown in FIG. 3A may be generated based on simulation model of a EUV mask, such as the uncorrected EUV mask 200 shown in FIG. 2A. In the images depicted in FIG. 3A, the difference between the light lines and the dark lines represent phase errors of a multilayer defect. Also, the average amount of arching in the lines represents amplitude errors of a multilayer error. For example, image 301 depicts a predicted image for an ideal EUV mask having no errors (i.e., defect height of 0.0 nm) and, correspondingly, no etch correction (i.e., etch depth of 0.0 nm). By comparison, image 305 depicts a predicted image for an EUV mask having a defect height of 3.0 nm and no corresponding etch correction (i.e., etch depth of 0.0 nm). The image 305 includes substantial phase and amplitude errors. Image 310 depicts a predicted image for an EUV mask having a defect height of 1.0 nm and a corresponding etch depth of 20.0 nm. Image 315 depicts a predicted image for an EUV mask having a defect height of 2.0 nm and a corresponding etch depth of 60.0 nm. Image 320 depicts a predicted image for an EUV mask having a defect height of 3.0 nm and a corresponding etch depth of 80.0 nm. And, image 325 depicts a predicted image for an EUV mask having a defect height of 3.0 nm and a corresponding etch depth of 100.0 nm.

Based on the exemplary image intensities shown in FIG. 3A for a particular EUV mask, such as that illustrated in FIG. 2A, an etch depth for a trench (e.g., trench 230) corresponding to a defect height can be determined that minimizes the phase and/or amplitude errors in the simulated device. For example, for a defect height of 3.0 nm, an etch depth of between about 80.0 nm and 100.0 nm may be selected since these values minimize the phase error of the EUV mask in comparison to other etch depths for that defect height, such as shown in image 305. Etch depths determined in accordance with aspects of the invention are not limited to those above, and etch depts. are contemplated within the scope of the invention.

Figure 3B:
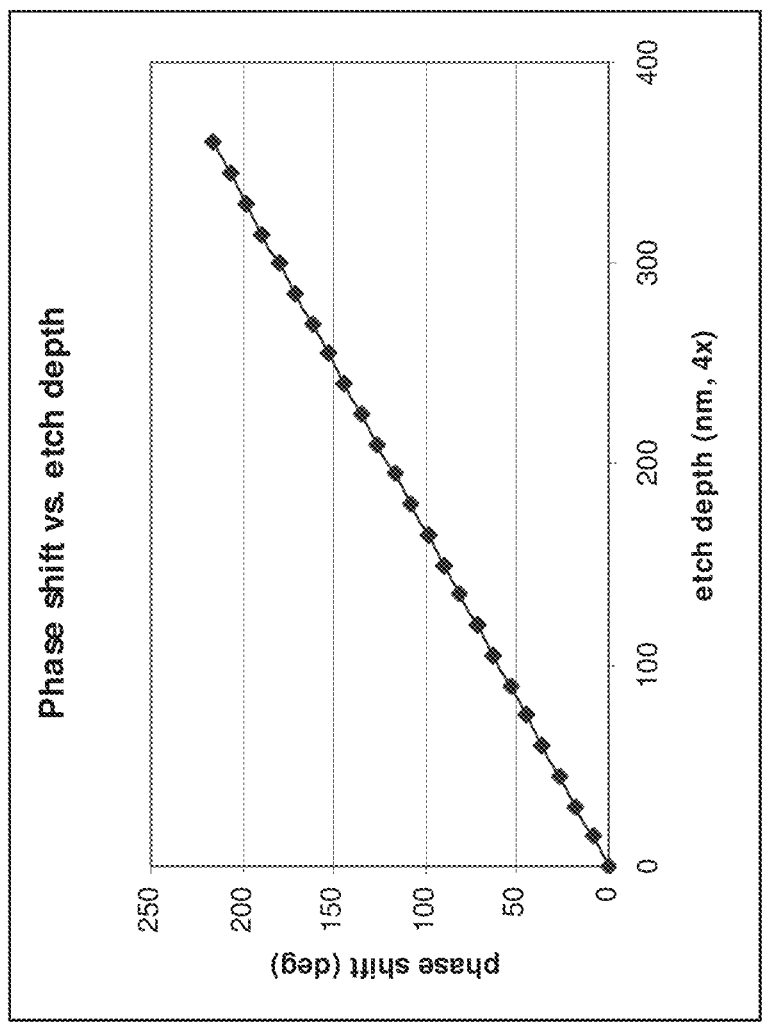
FIG. 3B shows a line graph illustrating relationships between phase error correction etch depth and phase shift for an exemplary EUV mask.

FIG. 3B is a line chart illustrating a relationship between an etch depth and a corresponding phase shift of the radiation produced by the multilayer mirror. In other words, phase shift caused in a multilayer mirror depends on the depth of a trench. More specifically, the phase shift imparted to radiation emitted from the etched part of an EUV mask is:

$$\frac{2\Delta nt}{\lambda \cos\Theta} = \frac{\Delta\phi}{2\pi} \qquad (1)$$

In the formula above, $\Delta\phi$ is the phase shift, $\Theta$ is the angle of incidence of the light, $\Delta n$ is the difference in the refractive index between the multilayer mirror and the vacuum surrounding the EUV mask, t is the etch depth, and $\lambda$ is the actinic wavelength. For example, where $\lambda n$ is equal to 0.03 and $\Theta$ is equal to 5 degrees, the relationship between the phase-shift and the depth of the etch (i.e., trench) is:

$$\frac{t}{\Delta\phi} \sim \frac{0.6 \text{ nm}}{\text{degree}} \qquad (2)$$

Figure 4A:
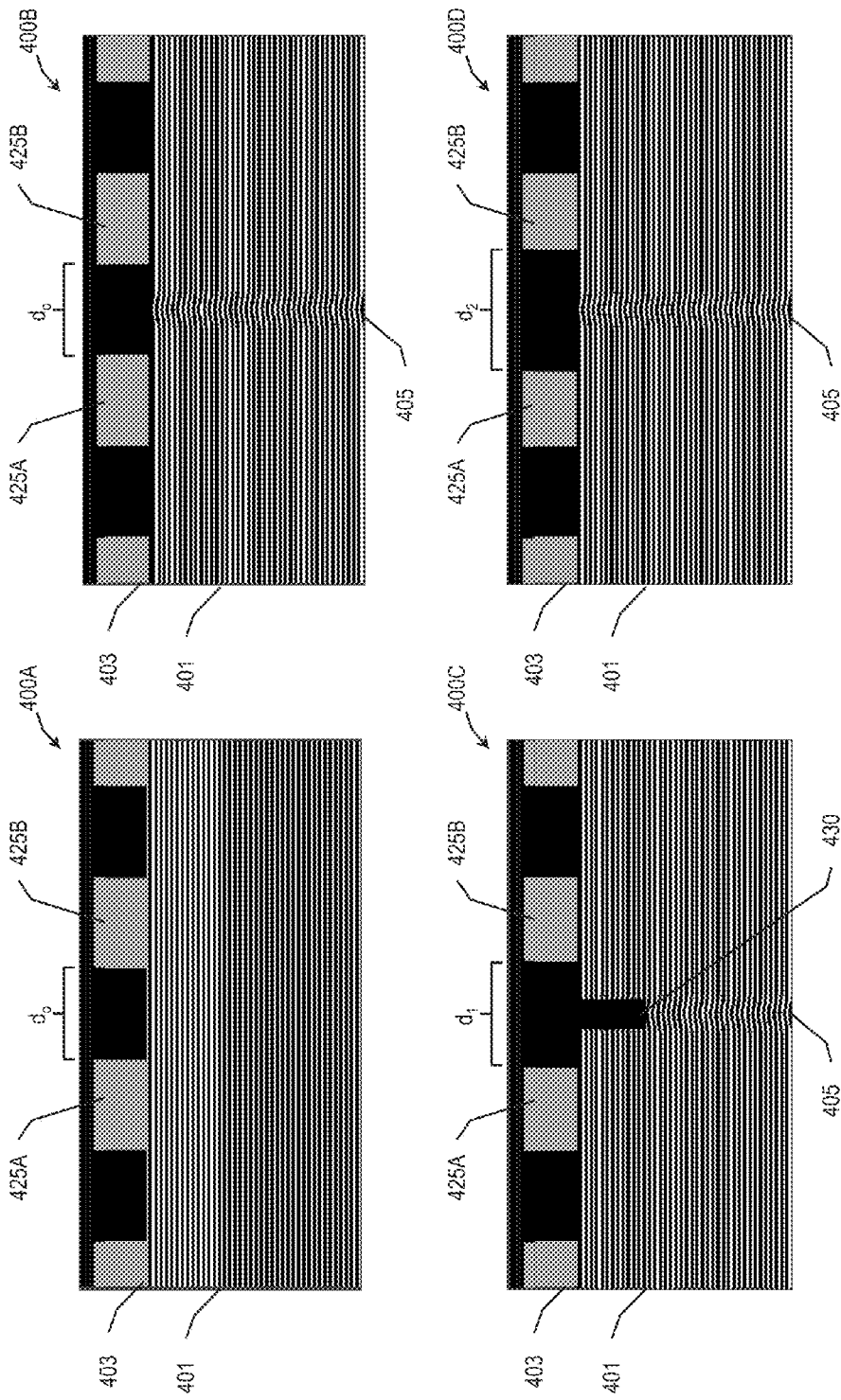
FIG. 4A shows a number of exemplary EUV masks, with and without error correction, in accordance with aspects of the present invention.

FIG. 4A depicts four exemplary EUV masks 400A, 400B, 400C, and 400D, wherein EUV mask 400C is formed according to aspects of the present invention, and EUV masks 400A, 400B, and 400D are illustrated for comparison. EUV mask 400A depicts an ideal device having no defects and no correction. EUV mask 400A includes a multilayer mirror 401. In addition, the EUV mask 400A includes a patterned mask layer 403 on the multilayer mirror 401, including features 425A and 425B (e.g., light absorbing material) spaced at a distance $d_0$. EUV mask 400B depicts a device having a bump defect and no correction. EUV mask 400C depicts a device having the bump defect 405, phase correction, and amplitude correction in accordance with embodiments of the present invention. More specifically, phase correction is provided by etching the multilayer mirror 401 to form a trench 430 over the bump defect 405. Amplitude correction is provided by biasing (e.g., increasing) the distance between features 425A and 425B from $d_0$ to $d_1$. EUV mask 400D depicts a device having the bump defect 405 and only amplitude correction. The amplitude correction for EUV mask 400D is provided by biasing the distance between the features 425A and 425B from $d_0$ to $d_1$. Although the phase error caused by the bump defect 505 is described above as being corrected using the trench 430, in accordance with aspects of the invention, the bump defect 505 can also be corrected using a material deposition, such as described with respect to device 500B in FIG. 5A. (See infra.)

Figure 4B:
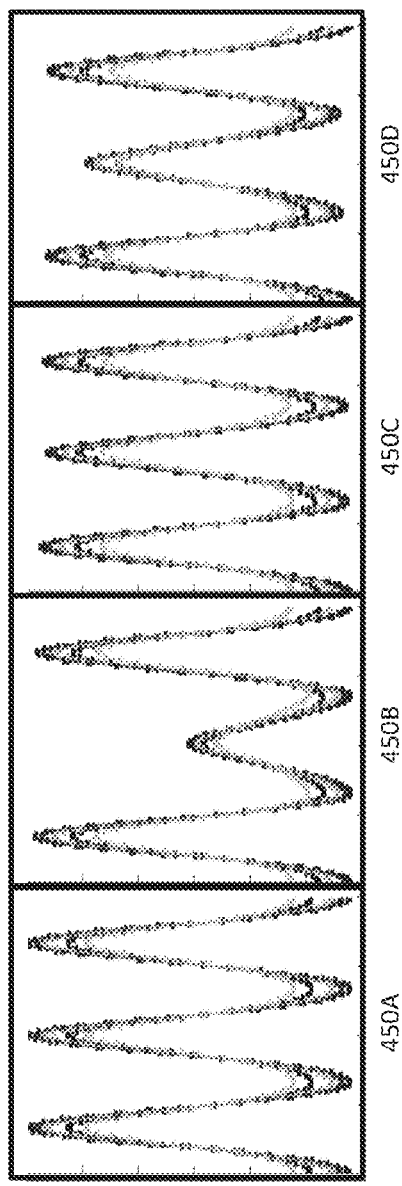
FIG. 4B shows exemplary images projected on a resist pattern of a semiconductor wafer by the EUV masks shown in FIG. 4A.

FIG. 4B depicts images 450A, 450B, 450C, and 450D produced in a resist layer of a wafer by each of the EUV masks 400A, 400B, 400C, and 400D illustrated in FIG. 4A, respectively. Image 450A, which corresponds to the EUV mask 400A, depicts the image produced by an ideal device having no defects and no correction. Image 450B, which corresponds to EUV mask 400B, depicts the image produced by a device having a bump defect and no correction. Image 450C, which corresponds to EUV mask 400C, depicts the image produced by a device having the bump defect, phase correction, and amplitude correction in accordance with aspects of the present invention. Image 450D, which corresponds to EUV mask 400D, depicts the image produced by a device having the bump defect and only amplitude correction. As evident from image 450C, the EUV mask 400C having phase and amplitude correction in accordance with aspects of the present invention substantially replicates the ideal image depicted in image 450A (i.e., EUV mask 400A), in which there is not defect and no correction. In contrast, image 450D, which depicts the EUV mask 400D having only bias correction distorted such that no amount of bias correction would make it reflect the image 450A.

Figure 4C:
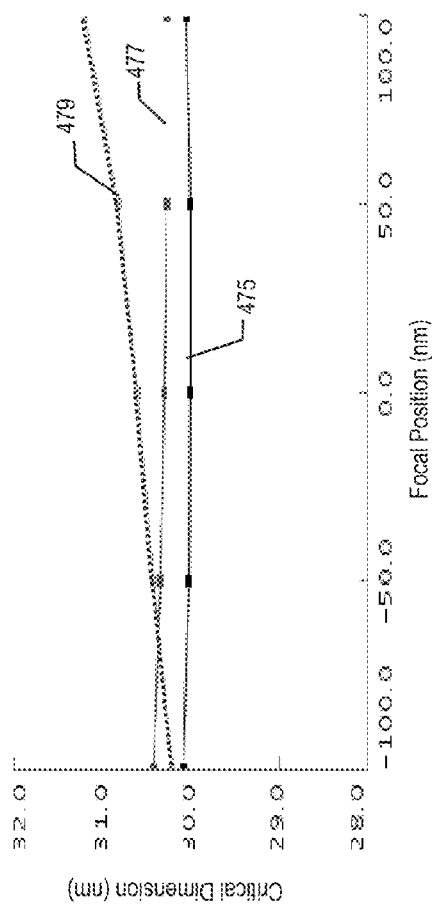
FIG. 4C shows Bossung plots for several of the EUV masks shown in FIG. 4A.

FIG. 4C depicts Bossung plots for the EUV masks 400A . . . 400D shown in FIG. 4A. The Bossung plots depict a critical dimension (e.g., line width) at a wafer threshold for different focal positions. Focal position is defined as zero at the wafer threshold, such that a negative focal position (e.g., −50.0) indicates that the plane of focus is inside the wafer. Variations in the critical dimension over the focal positions are indicative of focus issues that may result in defects in devices produced by an EUV mask.

Lines 475, 477, and 479 correspond to the EUV masks 400A, 400C, and 400D, respectively, wherein line 475 corresponds to the ideal device having no defect and no correction. As apparent from a comparison of lines 475 and 477, the EUV mask 400C having phase and amplitude correction in accordance with aspects of the present invention substantially mirrors the ideal EUV mask 400A over the different focal positions. In contrast, the line 479, which corresponds to the EUV mask 400D having only amplitude correction, substantially diverges from the ideal over the different focal positions. As such, it is evident from FIG. 4C that the corrections provided for EUV mask 400C are more effective in eliminating errors in a EUV mask than performing amplitude correction alone.

Consequently, devices produced from EUV masks corrected according to aspects of the present invention have fewer defects.

Figure 5A:
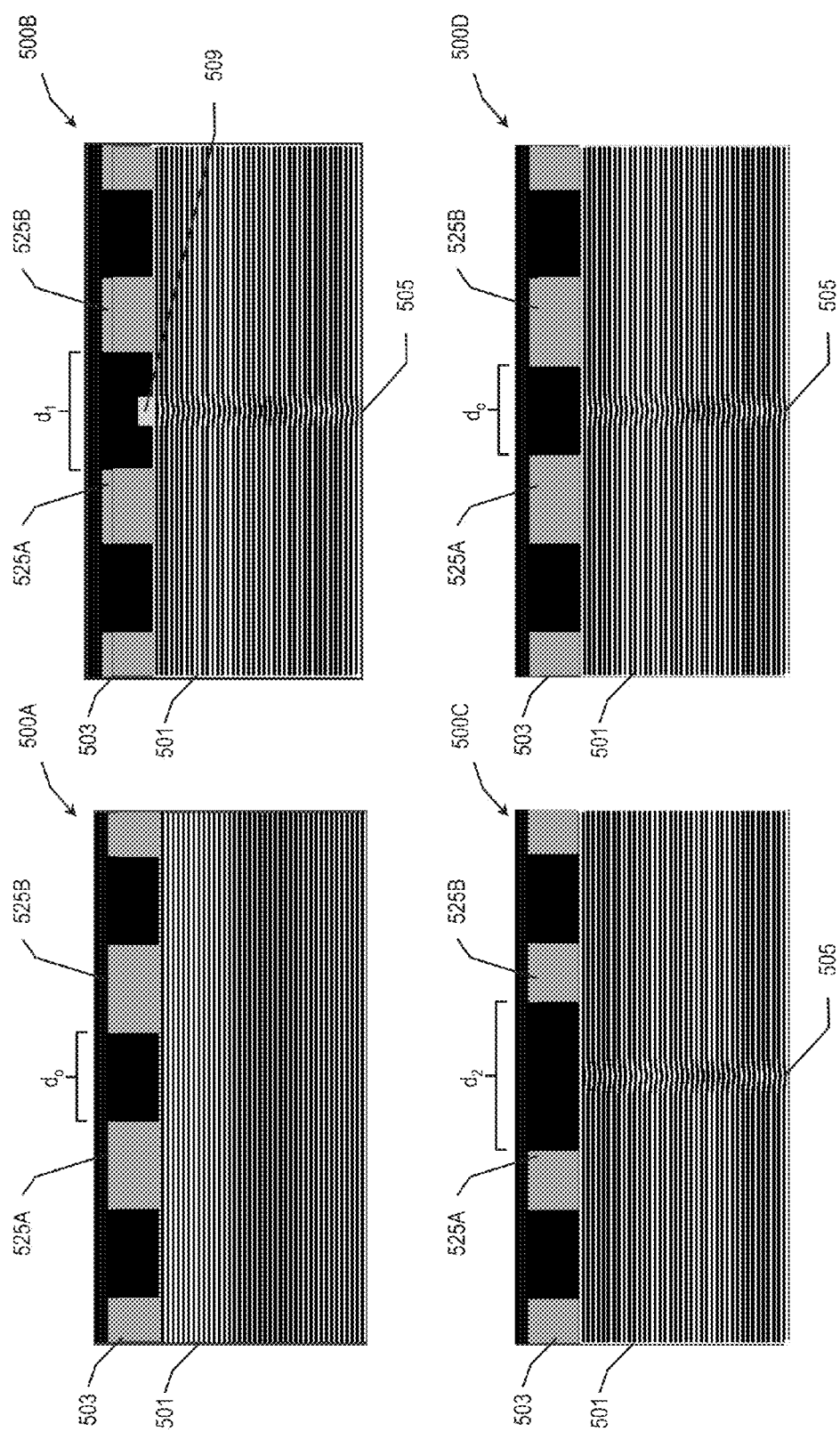
FIG. 5A shows a number of exemplary EUV masks, with and without error correction, in accordance with aspects of the present invention.

FIG. 5A depicts four exemplary EUV masks 500A, 500B, 500C, and 500D, wherein EUV mask 500B is formed according to aspects of the present invention and EUV masks 500A, 500C, and 500D are illustrated for comparison. EUV mask 500A depicts an ideal device having no defects and no correction. EUV mask 500A includes a multilayer mirror 501. In addition, the EUV mask 500A includes a patterned mask layer 503 on the multilayer mirror 501, including features 525A and 525B (e.g., light absorbing material) spaced at a distance $d_0$. EUV mask 500B depicts a device having a pit defect 505, as well as phase correction and amplitude correction in accordance with embodiments of the present invention. More specifically, phase correction is provided by depositing a material 509 on the multilayer mirror 501 over the pit defect 505. Amplitude correction is provided by biasing (e.g., increasing) the distance between features 525A and 525B from $d_0$ to $d_1$. EUV mask 500C depicts a device having the pit defect 505 and only amplitude correction. The amplitude correction for EUV mask 500C is provided by biasing the distance between the features 425A and 425B from $d_0$ to $d_2$. EUV mask 500D depicts a device having the pit defect 505 and no correction (e.g., no amplitude correction).

As depicted by EUV mask 500B, according to aspects of the invention, the phase error caused by the pit defect 505 is corrected by depositing the material 509 (e.g., Ruthenium (Ru)) on the surface multilayer mirror 501 of the device over the pit defect 505. Pit defects, such as pit defect 505, cause a phase shift in the light emitted from a multilayer mirror that is opposite to the phase shift caused by a bump defect. As such, the phase shift error caused by the pit defect 505, for example, is corrected using a material 509 deposited on the surface of the multilayer mirror 501 that acts as a phase shifter that counteracts the phase shift of the pit defect. The size and/or shape of the material 509 deposited is based on the size and/or the shape of the defect 505. In embodiments, the material 509 is locally deposited by decomposing an absorbed organometallic using an electron or ion beam, although it is also contemplated that a laser beam may be used. The organometallic compound can be selected based on a vapor pressure and a deposited metal. The organometallic compound adsorbs on the surface, and when hit by the electron or ion beam, the compound decomposes leaving behind the non-volatile components, which includes the metal and, typically, some carbon. The thickness of the material 509 can be increased by increasing number of repetitions the ion or electron beam is scanned over the surface of the multilayer mirror 501. Although the phase error caused by the pit defect 505 is described above as being corrected by material deposition, in accordance with aspects of the invention, the pit defect can also be corrected with a trench correction, such as described above with respect to device 400C in FIG. 4A. However, it is noted that in general a larger trench would be needed to correct a pit defect than a bump defect, and thus would induce a larger amplitude error and require a larger amplitude bias correction in the absorber layer.

Further, the amplitude error of the EUV mask 500B can be corrected by biasing (altering) to a distance $d_1$ between the features 525A and 525B in the mask layer 503 over the pit defect, which is different than the distance $d_0$ in the EUV masks 500A and 500D. In contrast, the EUV mask 500C only attempts to correct the pit defect using amplitude correction by biasing the distance between features 525A and 525B from a distance of $d_0$ to a distance of d2.

FIG. 5B depicts images 550A, 550B, 550C, and 550D produced in a resist layer of a wafer by each of the EUV masks 500A, 500B, 500C, and 500D illustrated in FIG. 5A, respectively. Image 550A, which corresponds to the EUV mask 500A, depicts the image produced by an ideal device having no defects and no correction. Image 550B, which corresponds to EUV mask 500B, depicts the image produced by a depicts a device having the pit defect 505 corrected using phase and amplitude correction, in accordance with aspects of the present invention. Image 550C, which corresponds to EUV mask 500C, depicts the image produced by a device having the pit defect 505 and only amplitude correction. Image 550D, which corresponds to EUV mask 500D, depicts the image produced by depicts a device having the pit defect 505 and no correction.

As evident from image 550B, the EUV mask 500A having both phase and amplitude correction for the pit defect 505 in accordance with aspects of the present invention provides that best match of the ideal case depicted in image 550A (e.g., EUV mask 500A). Further, from image 550B, the error correction provided by EUV mask 500B results in a substantial improvement over the EUV mask 500D, which has no correction for the pit defect 505. Notably, image 550C, which depicts the EUV mask 500C having only amplitude correction is distorted such that no amount of bias correction would make it reflect the nominal image 511.

FIG. 5C is a line chart comparing Bossung plots for EUV masks 500A and 500B. More specifically, Bossung plot 575 corresponds to the ideal EUV mask 500A, having no errors and no correction. Bossung plot 580 corresponds to the EUV mask 500B, which includes phase and amplitude corrections, in accordance with aspects of the present invention. As shown in FIG. 5C, the Bossung curves of plot 580 substantially reflects that of the Bossung curves of plot 575 over the illustrated depth of focus.

FIG. 5D is a line chart comparing Bossung plots for EUV masks 500A and 500C. As in FIG. 5C, Bossung plot 575 corresponds to the ideal EUV mask 500A, having no errors and no correction. Bossung plot 585 corresponds to the EUV mask 500C, which includes only amplitude correction. As apparent from the Bossung plots in FIG. 5D, the critical dimensions produced by the EUV mask 500C substantially diverge from that of the ideal EUV mask 500A, over the illustrated depth of focus. Accordingly, error correction achieved by the EUV mask 500B is superior to that achieved by the EUV mask 500C.

Figure 6A:
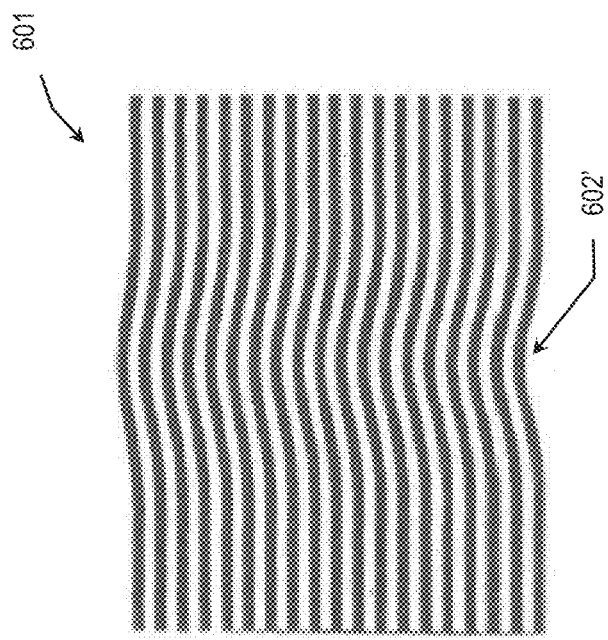
FIGS. 6A and 6B show an error correction process using an ion beam, in accordance with aspects of the invention.
Figure 6B:
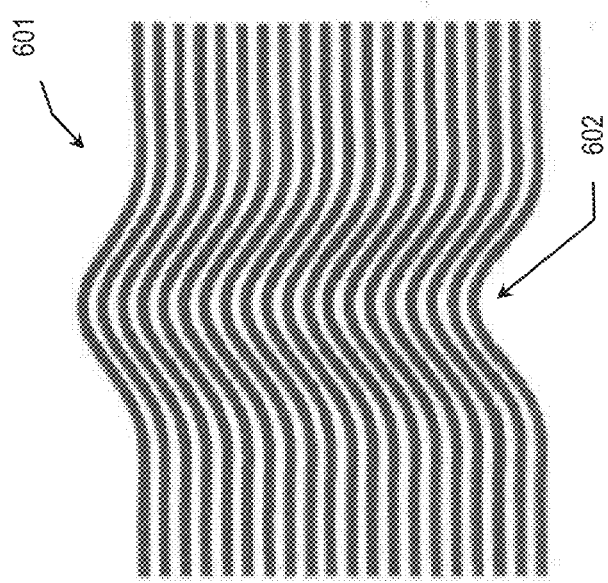

FIGS. 6A and 6B illustrate an error correction process using an ion beam in accordance with aspects of the invention. Multilayer mirror 601 in FIG. 6A includes a bump defect 602. In embodiments, the bump defect 602 in the multilayer mirror 601 is corrected by bombarding the areas of the multilayer mirror 601 over the bump defect 602 with an ion beam. In embodiments, the multilayer mirror 601 is comprised of molybdenum (Mo) and silicon (Si). Irradiating the multilayer mirror 601 with a beam of, for example, He or Si ions, induces interdiffusion of Mo and Si, which results in a volume reduction. The extent of the interdiffusion increases as the time of the ion bombardment increases, such that the volume reduction corresponds to the time of the ion bombardment. According to aspects of the present invention, the localized ion beam penetrates the layers of the multilayer mirror 601, causing intermixing of the Mo and Si within the multilayer mirror 601. FIG. 6B depicts the multilayer mirror 601 after correction using the ion beam. As shown, the bump defect 602' is substantially reduced in comparison to the bump defect 602. The reflected phase and amplitude of the radiation produced by multilayer mirror 601 are, thereby, affected. In accordance with aspects of the invention, amplitude correction can be performed by biasing a mask layer over the multilayer mirror, as shown for example, in EUV mask 400C in FIG. 4A.

Figure 7A:
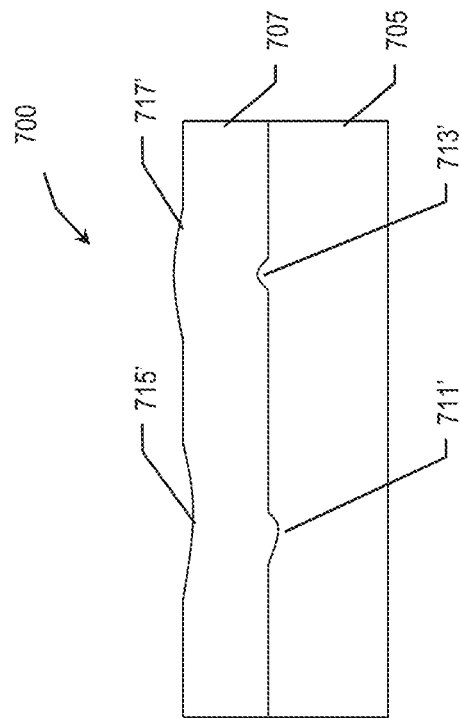
FIGS. 7A and 7B show an error correction process using helium, in accordance with aspects of the present invention.
Figure 7B:
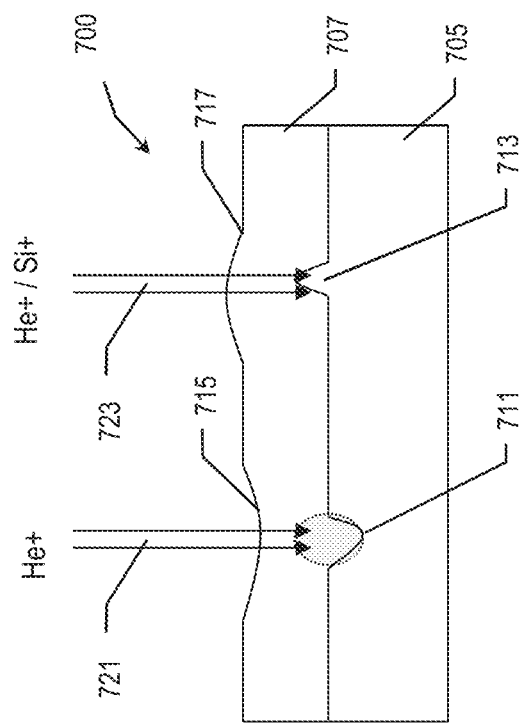

FIGS. 7A and 7B illustrate an error correction technique using helium, in accordance with aspects of the present invention. In embodiments, EUV mask 700 is comprised of a substrate 705 and a multilayer mirror 707 that contains multilayer defects. For example, EUV mask 700 includes a pit defect 711 and a bump defect 713 in the substrate 705, which result in corresponding defects in focus and/or intensity of the radiation emitted in the multilayer mirror 707 at locations 715 and 717 corresponding to the defects 711 and 713. According to aspects of the invention, the pit defect 711 is corrected by implanting a helium bubble in or below the surface of the multilayer mirror 707 to modify the phase error. In embodiments, a helium ion beam 721 is used to produce a bubble in the glass substrate 705 or deep in the multilayer mirror 707 to flatten location 715 in the multilayer mirror 707. Further, according to aspects of the invention, the bump defect 713 is corrected by densifying/interdiffusing the layers of the multilayer mirror 707 using an ion beam 723 (e.g. He/Be/Si) to flatten the phase "bump" at location 717, e.g., as described above with respect to FIGS. 6A and 6B. As depicted in FIG. 7B, the effects of the defects 711' and 713' at locations 715' and 717' are substantially reduced in comparison to the corresponding defects in FIG. 7A. The reflected phase and amplitude of the radiation produced by multilayer mirror 707 are, thereby, affected. In accordance with aspects of the invention, amplitude correction can be performed by biasing a mask layer over the multilayer mirror, as shown for example, in EUV mask 400C in FIG. 4A.

Figure 8:
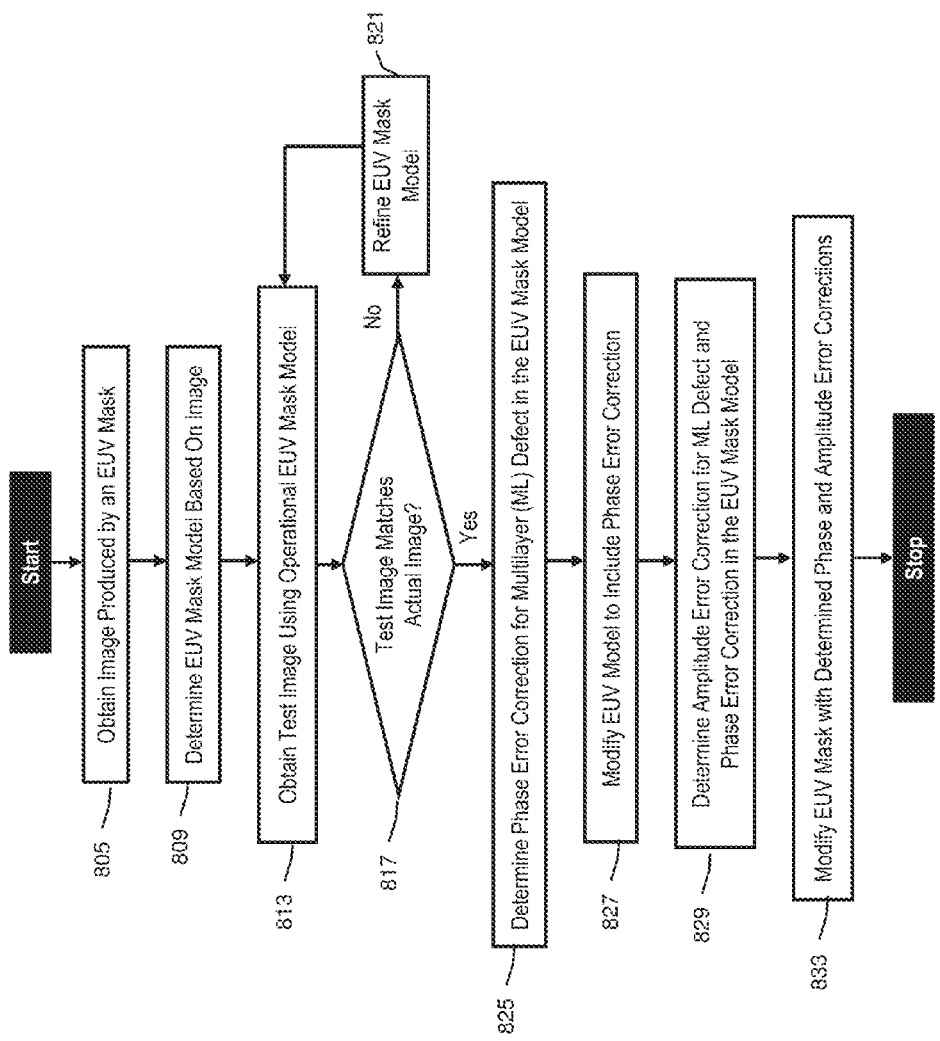
FIG. 8 shows a flow diagram of an exemplary process for correcting EUV masks, in accordance with aspects of the present invention.

FIG. 8 shows an exemplary flow diagram of an exemplary process for performing aspects of the present invention. The steps of FIG. 8 can be implemented in any of the EUV devices of FIGS. 1-7. The flowchart in FIG. 8 illustrates the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

FIG. 8 shows a flow diagram of an exemplary process for correcting an EUV mask in which correction of a multilayer defect occurs in at least two stages. One of the stages corrects phase errors caused by a defect in a multilayer mirror. Another of the stages corrects amplitude errors caused by the defect and by the phase error correction. More specifically, the EUV mask correction process may start at step 805, in which an actual image produced by the EUV mask in a resist layer of a wafer is obtained. The EUV mask may include one or more defects that cause errors in the obtained image. The defects can include, for example, a bump defect or a pit defect that produce errors in a image, such as those discussed previously with respect to FIGS. 1-7.

At step 809, the EUV mask is modeled based on the actual image obtained at step 805. In embodiments, a design model of the EUV device that was used to fabricate the EUV device may already exist. For example, prior to fabrication, the EUV device may have been designed and simulated using electronic computer-aided design (ECAD) software. This design model may represent a ideal EUV mask that lacks any errors or corrections, such as those EUV masks 400A and 500A, discussed above with respect to FIGS. 4A and 5A, respectively.

In accordance with aspects of the present invention, an operational model is generated by modifying the design model such that the operational model simulates the actual image from step 805. That is, the model used to design and manufacture the EUV mask can be modified to represent one or more multilayer defects in the actual EUV mask. In embodiments, the design model is modified by adding representations of defects that are expected to simulate the actual defects in the actual EUV mask. For example, the test engineer can modify the operation model to include defects (e.g., bump defect or pit defect) corresponding to regions of the test image that have errors.

At step 813, a test image representing an image that would be generated using the operational EUV model is obtained through, e.g., modeling and simulation. For example, the test engineer performs simulation testing of the operational model from step 809 to obtain the test image using electronic computer-aided modeling software. At step 817, it is determined whether the obtained test image substantially matches the actual image. If not, at step 821, the operational model is refined to better match the actual image, and the process iteratively returns to step 817. For example, the test engineer may modify the type of defect (e.g., bump defect or pit defect) and/or the corresponding height of the defect in the operational model until the test image produced by the operational model matches the actual image from step 805.

At step 817, if it is determined that the test image sufficiently matches the actual image, then at step 825, a phase error correction is determined for the multilayer defect represented in the operational model. For example, as discussed above with respect to FIG. 3A, a test engineer may select an etch depth for a trench corresponding to the height of the defect included in the operational model that minimizes the phase error produced by the defect. At step 827, the operational model is modified to include a representation of the phase error correction.

At step 829, an amplitude error correction for the multilayer defect and the phase error correction represented in the operational model is determined. For example, the test engineer may select an amplitude error correction that minimizes the amplitude error of the operational model produced by the modeled defect and the modeled phase correction (e.g., trench). The amplitude correction may be performed by iteratively changing the distance between features of the mask layer (i.e., biasing) of the operation model to minimize the amplitude error produced by the model in comparison to an ideal EUV mask.

At step 833, the EUV mask is modified with the determined phase and error corrections. For example, as discussed above with respect to FIGS. 2A, 2B, 2C, and 4A, the multilayer mirror of the EUV mask may be etched to form a trench at the locations and depths, as determined at step 825, and the absorber material may be removed to increase the distance between features of the mask layer, as determined in step 829. Additionally or alternatively, as discussed above with respect to FIG. 5A, the multilayer mirror of the EUV mask may be modified by depositing a material on the surface of the multilayer mirror over a pit defect. Further, as discussed above with respect to FIGS. 6A and 6B, an ion beam may used to reduce the warping in the multilayer mirror at locations of bump defects. Further, as discussed above with respect to FIGS. 7A and 7B, helium may be used to reduce the amount of warping in the multilayer mirror due to a pit defect.

In accordance with the above-described aspects of the present invention, the accuracy of a EUV mask is maximized by performing a first stage of error correction that corrects phase errors and another stage of error correction that corrects amplitude errors caused by the defect and by the phase correction. By maximizing the accuracy of the EUV masks, devices manufactured with the mask can have narrower design margins (e.g., feature spacing), greater reliability, and better production yields to the improved accuracy of critical dimensions of features formed using the EUV mask.

Figure 9:
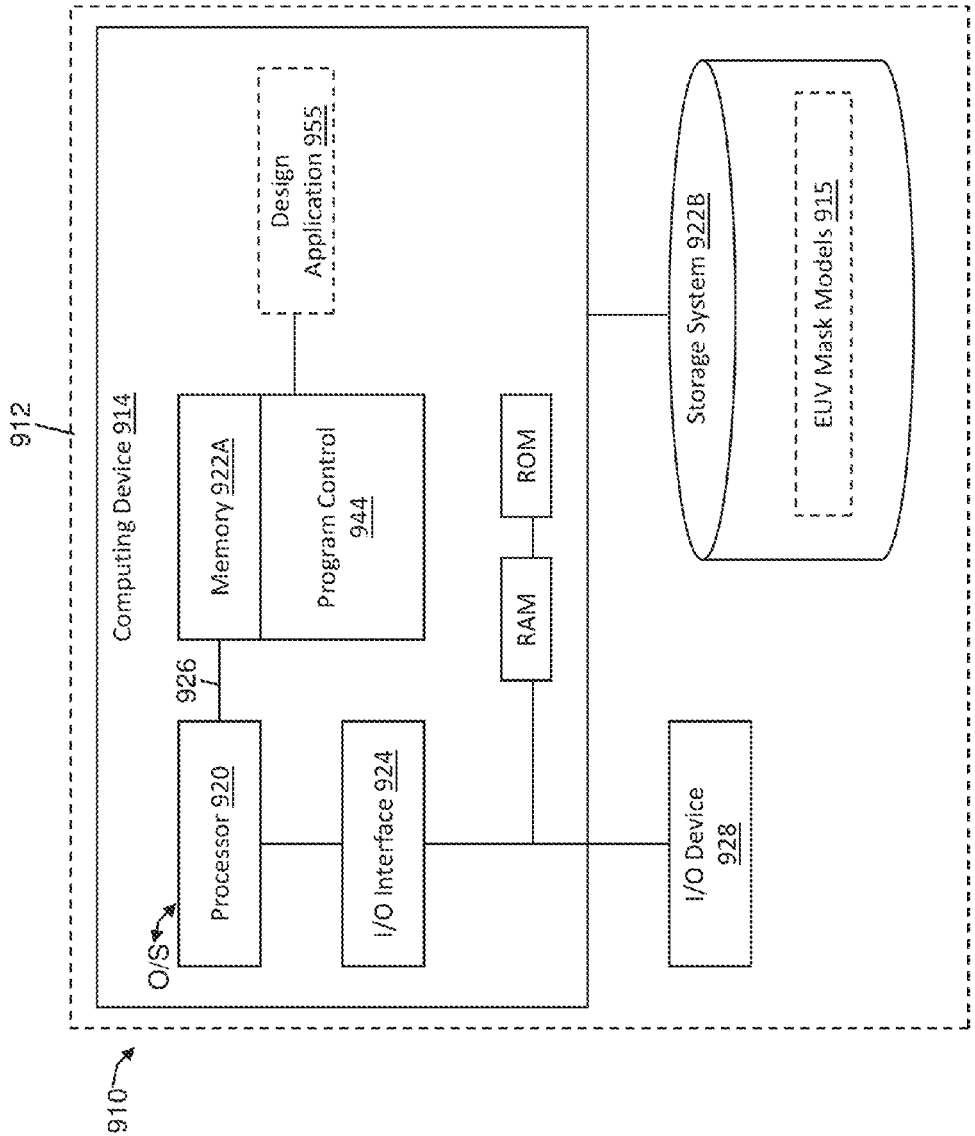
FIG. 9 shows a computing environment, in accordance with aspects of the present invention.

FIG. 9 is an exemplary environment 910 for implementing the steps in accordance with aspects of the invention, such as the steps described with respect to FIG. 8. To this extent, the environment 910 includes a server or other computing infrastructure 912 that can perform the processes described herein. In particular, the computer infrastructure 912 includes a computing device 914. The computing device 914 can be resident on a network infrastructure or computing device of a third party service provider (any of which is generally represented in FIG. 9).

The computing device 914 also includes a processor 920, memory 922A, an I/O interface 924, and a bus 926. The memory 922A can include local memory employed during actual execution of program code, bulk storage, and cache memories which provide temporary storage of at least some program code in order to reduce the number of times code must be retrieved from bulk storage during execution. In addition, the computing device includes random access memory (RAM), a read-only memory (ROM), and an operating system (O/S).

The computing device 914 is in communication with the external I/O device 928 and a storage system 922B. For example, the I/O device 928 can comprise any device that enables an individual to interact with the computing device 914 (e.g., user interface) or any device that enables the computing device 914 to communicate with one or more other computing devices using any type of communications link. The external I/O device/resource 928 may be for example, a handheld device, PDA, handset, keyboard etc.

In general, the processor 920 executes computer program code (e.g., program control 944), which can be stored in the memory 922A and/or storage system 922B. Moreover, in accordance with aspects of the invention, the program control 944 controls a design application 955 that perform one or more of the processes described herein (e.g., the steps of FIG. 8). The design application 955 can be implemented as one or more sets of program code in the program control 944 stored in memory 922A as separate or combined modules. Additionally, the design application 955 may be implemented as separate dedicated processors or a single or several processors to provide the function of these tools.

While executing the computer program code, the processor 920 can read and/or write data to/from the memory 922A, the storage system 922B, and/or the I/O interface 924. The program code executes the processes of the invention, for example, the design application 955. Further, data read and/or write data to/from the memory 922A, the storage system 922B, and/or the I/O interface 924 may include EUV mask models 915. The bus 926 provides a communication link between each of the components in the device 914.

In accordance with aspects of the invention, the design application 955 is computer program code stored in, for example, memory 922A and/or storage system 922B that, when executed by the processor 920, causes the computing device 914 to model and simulate the operation of the EUV mask models 915, for example, as described above with respect to FIG. 8. The design application 955 may include one or more software or hardware modules for designing, modeling and verifying IC designs using a hardware description language, such as VERILOG or VHDL. For instance, the design application 955 may be a synthesis/placement CAD tool that reads in design definitions (e.g., VHDL), physical area constraints, timing constraints, power constraints, design library information, synthesis rules, and operating conditions. Using these various parameters, the design application 955 may iteratively determine physical and operations characteristics of the EUV mask models 915.

The design application 955 may determine EUV mask models 915 based information stored in storage system 922B (and/or memory 922A). The stored information can include descriptive information (e.g., design comments, version information, debugging histories and verification data) and requirement information (e.g., physical information, timing requirements, and netlists). For instance, the logic blocks of the EUV mask models 915 may be defined by a user (e.g., design engineer) using a hardware design language (HDL) files (e.g., Very-Large scale Integrated Circuit Hardware Description Language (VHDL)). Also, EUV mask models 915 may define the physical area available for element placement of multilayer defect corrections, such as described above with respect to FIGS. 2-8.

The computing device 914 can comprise any general purpose computing article of manufacture capable of executing computer program code installed thereon (e.g., a personal computer, server, etc.). However, it is understood that the computing device 914 is only representative of various possible equivalent-computing devices that may perform the processes described herein. To this extent, in embodiments, the functionality provided by the computing device 914 can be implemented by a computing article of manufacture that includes any combination of general and/or specific purpose hardware and/or computer program code. In each embodiment, the program code and hardware can be created using standard programming and engineering techniques, respectively.

Similarly, the computing infrastructure 912 is only illustrative of various types of computer infrastructures for implementing the invention. For example, in embodiments, the server 912 comprises two or more computing devices (e.g., a server cluster) that communicate over any type of communications link, such as a network, a shared memory, or the like, to perform the process described herein. Further, while performing the processes described herein, one or more computing devices on the server 912 can communicate with one or more other computing devices external to the server 912 using any type of communications link. The communications link can comprise any combination of wired and/or wireless links; any combination of one or more types of networks (e.g., the Internet, a wide area network, a local area network, a virtual private network, etc.); and/or utilize any combination of transmission techniques and protocols.

Figure 10:
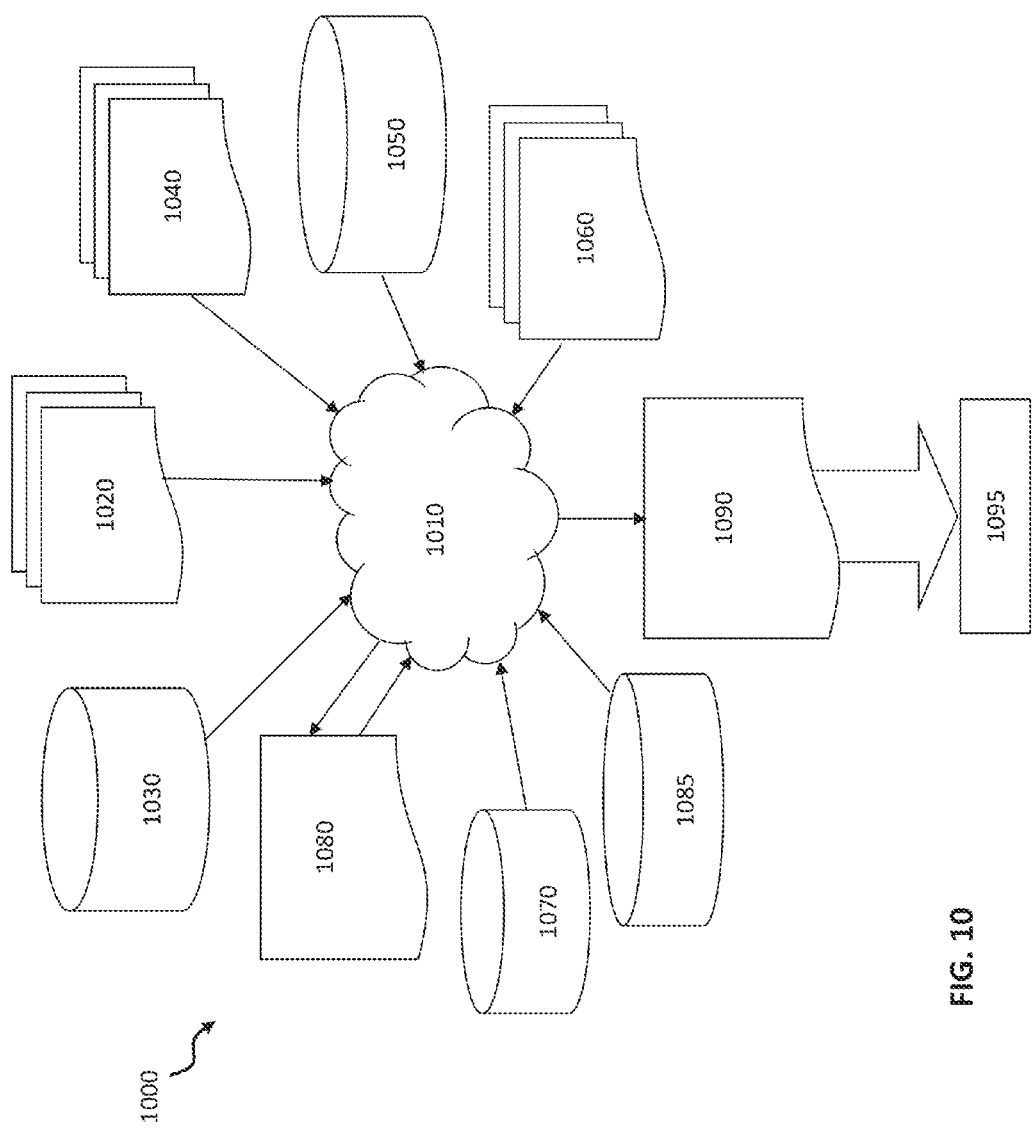
FIG. 10 shows a flow diagram of a design process used in semiconductor design, manufacture, and/or test in accordance with aspects of the present invention.

FIG. 10 is a flow diagram of a design process used in semiconductor design, manufacture, and/or test. FIG. 10 shows a block diagram of an exemplary design flow 1000 used for example, in semiconductor IC logic design, simulation, test, layout, and manufacture. Design flow 1000 includes processes, machines, and/or mechanisms for processing design structures or devices to generate logically or otherwise functionally equivalent representations of the design structures and/or devices and shown in FIGS. 1-7. The design structures processed and/or generated by design flow 1000 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1000 may vary depending on the type of representation being designed. For example, a design flow 1000 for building an application specific IC (ASIC) may differ from a design flow 1000 for designing a standard component or from a design flow 1000 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 1020 that is preferably processed by a design process 1010. Design structure 1020 may be a logical simulation design structure generated and processed by design process 1010 to produce a logically equivalent functional representation of a hardware device. Design structure 1020 may also or alternatively comprise data and/or program instructions that when processed by design process 1010, generate a functional representation of the physical structure of a hardware device. Whether representing functional and/or structural design features, design structure 1020 may be generated using electronic computer-aided design (ECAD) such as implemented by a core developer/designer. When encoded on a machine-readable data transmission, gate array, or storage medium, design structure 1020 may be accessed and processed by one or more hardware and/or software modules within design process 1010 to simulate or otherwise functionally represent an electronic component, circuit, electronic or logic module, apparatus, device, or system and shown in FIGS. 1-7. As such, design structure 1020 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1010 preferably employs and incorporates hardware and/or software modules (e.g., the design application 955) for synthesizing, translating, or otherwise processing a design/simulation functional equivalent of the components, circuits, devices, or logic structures shown in FIGS. 1-6 to generate a netlist 1080 which may contain design structures such as design structure 1020. Netlist 1080 may comprise, for example, compiled or otherwise processed data structures representing a list of wires, discrete components, logic gates, control circuits, I/O devices, models, etc. that describes the connections to other elements and circuits in an integrated circuit design. Netlist 1080 may be synthesized using an iterative process in which netlist 1080 is resynthesized one or more times depending on design specifications and parameters for the device. As with other design structure types described herein, netlist 1080 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1010 may include hardware and software modules for processing a variety of input data structure types including netlist 1080. Such data structure types may reside, for example, within library elements 1030 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 1040, characterization data 1050, verification data 1060, design rules 1070, and test data files 1085 which may include input test patterns, output test results, and other testing information. Design process 1010 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1010 without deviating from the scope and spirit of the invention. Design process 1010 may also include modules for performing standard circuit design processes such as timing analysis, verification, design rule checking, place and route operations, etc.

Design process 1010 employs and incorporates logic and physical design tools such as HDL compilers and simulation model build tools to process design structure 1020 together with some or all of the depicted supporting data structures along with any additional mechanical design or data (if applicable), to generate a second design structure 1090. Design structure 1090 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 1020, design structure 1090 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-7. In one embodiment, design structure 1090 may comprise a compiled, executable HDL simulation model that functionally simulates the devices shown in FIGS. 1-7.

Design structure 1090 may also employ a data format used for the exchange of layout data of integrated circuits and/or symbolic data format (e.g. information stored in a GDSII (GDS2), GL1, OASIS, map files, or any other suitable format for storing such design data structures). Design structure 1090 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure shown in FIGS. 1-7. Design structure 1090 may then proceed to a stage 1095 where, for example, design structure 1090: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A method, comprising:
   determining an amplitude error correction for a mask based on both a defect in the mask and a phase error correction determined for the defect; and
   modifying the mask with the determined phase error correction and the determined amplitude error correction.

2. The method of claim 1, wherein the modifying the mask with the amplitude error correction comprises modifying a pattern of a mask layer of the mask.

3. The method of claim 2, wherein the modifying the pattern of the mask layer comprises changing a distance between features in the pattern above the defect and the phase error correction.

4. The method of claim 1, wherein:
   the defect is a bump or a pit defect; and
   the modifying the mask comprises etching a trench in a multilayer mirror of the mask over the defect.

5. The method of claim 4, wherein a depth of the trench is based on a height of the bump defect or depth of the pit defect.

6. The method of claim 1, wherein the modifying the mask comprises bombarding a multilayer mirror of the mask above the defect with an ion beam.

7. The method of claim 1, wherein the modifying the mask comprises depositing a material on a multilayer mirror of the EUV mask at a location on a surface of the multilayer mirror above the defect.

8. The method of claim 7, wherein a thickness of the deposited material is based on the optical properties of the deposited material and the size of the defect.

9. The method of claim 1, wherein the modifying the mask comprises injecting a helium bubble in a multilayer mirror of the mask at a location of the defect.

\* \* \* \* \*